(12) United States Patent
Takemura

(10) Patent No.: US 6,310,362 B1
(45) Date of Patent: Oct. 30, 2001

(54) ELECTRO-OPTICAL DEVICE

(76) Inventor: Yasuhiko Takemura, Flat Atsugi 208, 931-1, Hase, Atsugi-shi, Kanagawa-ken, 243 (JP)

( * ) Notice: Subject to any disclaimer, the term of this patent is extended or adjusted under 35 U.S.C. 154(b) by 0 days.

(21) Appl. No.: 09/426,729

(22) Filed: Oct. 26, 1999

Related U.S. Application Data

(62) Division of application No. 08/707,580, filed on Sep. 5, 1996, now Pat. No. 6,051,453, which is a continuation of application No. 08/298,745, filed on Aug. 31, 1994, now abandoned.

(30) Foreign Application Priority Data

Sep. 7, 1993 (JP) ..................................... 5-246410

(51) Int. Cl.$^7$ ........................... H01L 29/04; H01L 31/20; H01L 31/036; H01L 31/0376
(52) U.S. Cl. .............................. 257/59; 257/72; 257/350; 257/408
(58) Field of Search .............................. 257/59, 72, 350, 257/408

(56) References Cited

U.S. PATENT DOCUMENTS

| | | |
|---|---|---|
| 4,727,044 | 2/1988 | Yamazaki . |
| 5,147,826 | 9/1992 | Liu et al. . |
| 5,250,444 | 10/1993 | Khan et al. . |
| 5,254,208 | 10/1993 | Zhang . |
| 5,275,851 | 1/1994 | Fonash et al. . |
| 5,278,093 | 1/1994 | Yonehara . |
| 5,306,651 | 4/1994 | Masumo et al. . |
| 5,308,998 | 5/1994 | Yamazaki et al. . |
| 5,323,042 * | 6/1994 | Matsumoto ........................... 257/350 |
| 5,352,291 | 10/1994 | Zhang et al. . |
| 5,359,219 * | 10/1994 | Hwang ................................. 257/351 |
| 5,488,000 | 1/1996 | Zhang et al. . |
| 5,521,107 | 5/1996 | Yamazaki et al. . |
| 5,552,624 * | 9/1996 | Skotnicki et al. ................... 257/350 |
| 5,583,369 | 12/1996 | Yamazaki et al. . |
| 5,696,386 | 12/1997 | Yamazaki . |
| 5,849,043 | 12/1998 | Zhang et al. . |
| 5,913,112 | 6/1999 | Yamazaki et al. . |
| 5,962,870 | 10/1999 | Yamazaki et al. . |
| 6,013,928 | 1/2000 | Yamazaki et al. . |
| 6,051,453 | 4/2000 | Takemura . |

OTHER PUBLICATIONS

C. Hayzelden et al. "In Situ Transmission Electron Microscopy Studies of Silicide–Mediated Crystallization of Amorophous Silicon," (3 pages) 1991.

A.V. Dvurechenskii et al., "Transport Phenomena in Amorphous Silicon Doped by Ion Implantation of 3d Metals," Akademikian Lavrentev Prospekt 13, Novosibirsk, 90, USSR, pp. 635–640, 1987.

T. Hempel et al., "Needle–Like Crystallization of Ni Doped Amorphous Silicon Thin Films," Solid State Communications, vol. 85, No. 11, pp. 921–924, 1993.

G. Liu, et al., Polycrystalline Silicon Thin Film Transistors on Corning 7059 Glass Substrate Using Short Time, Low Temperature Processing, Appl. Phys. Lett. 62(20), May 17, 1993, American Institute of Physics, pp. 2554–2556.

(List continued on next page.)

Primary Examiner—Ngân V. Ngô

(57) ABSTRACT

A display device is disclosed. The display device comprises a glass substrate, and an insulating film provided on the glass substrate and comprising aluminum nitride containing from 0.01 to 20% by atomic of oxygen therein with respect to nitrogen. A thin film transistor and a pixel electrode are provided over the insulating film.

102 Claims, 4 Drawing Sheets

OTHER PUBLICATIONS

G. Liu, et al., "Selective Area Crystallization of Amorphous Silicon Films by Low–Temperature Rapid Thermal Annealing," Appl. Phys. Lett. 55 (7), Aug. 14, 1989 American Institute of Physics, pp. 660–662.

R. Kakkad, et al., "Low Temperature Selective Crystallization of Amorphous Silicon," Journal of Non–Crystalline Solids, vol. 115 (1989) pp. 66–68.

R. Kakkad, et al., "Crystallized Si Films by Low–Temperature Rapid Thermal Annealing of Amorphous Silicon," J. Appl. Phys. 65(5), Mar. 1, 1989, 1989 American Institute of Physics, pp. 2069–2072.

Korin et al., "Crystallization of Amorphous Silicon Films Using a Multistep Thermal Annealing Process," Thin Solid Films, 167 (1988), pp. 101–106.

* cited by examiner

VISIBLE OR NEAR INFRARED LIGHT

LASER LIGHT

PTFT    NTFT

ELECTRO-OPTICAL DEVICE

This application is a divisional of application Ser. No. 08/707,580 filed Sep. 5, 1996; now U.S. Pat. No. 6,051,653 which itself is a continuation of application Ser. No. 08/298,745 filed Aug. 31, 1994, now abandoned.

BACKGROUND OF THE INVENTION

1. Industrial Field of the Invention

The present invention relates to a process for fabricating an insulated gate-structured semiconductor device such as a thin film transistor (TFT) or a thin film diode (TFD), comprising a non-single crystal silicon film formed on an insulating substrate such as a glass substrate or on an insulating film formed on various type of substrate. The present invention also relates to a process for fabricating a thin film integrated circuit (IC) to which TFT or TFD is applied, and more particularly, to a thin film integrated circuit (IC) for an active-matrix type liquid crystal displaying unit.

2. Prior Art

Semiconductor devices developed heretofore comprising TFTs on an insulating substrate (such as a glass substrate) include an active matrix-addressed liquid crystal display device whose pixels are driven by TFTs, an image sensor, or a three-dimensional integrated circuit.

The TFTs utilized in those devices generally employ a thin film non-single crystal silicon semiconductor. The thin film non-single crystal semiconductors can be roughly classified into two; one is a type comprising amorphous silicon semiconductor (a—Si), and the other is a type comprising crystalline silicon semiconductors. Amorphous silicon semiconductors are most prevailing, because they can be fabricated relatively easily by a vapor phase process at a low temperature, and because they can be readily obtained by mass production. The physical properties thereof, such as electric conductivity, however, are still inferior to those of a crystalline silicon semiconductor. Thus, to implement devices operating at an even higher speed, it has been keenly demanded to establish a process for fabricating TFTs comprising crystalline silicon semiconductors. Known crystalline semiconductors suitable for the purpose like this include polycrystalline silicon, microcrystalline silicon, amorphous silicon partly comprising crystalline components, and semi-amorphous silicon which exhibits an intermediate state between crystalline silicon and amorphous silicon.

Known process for fabricating crystalline thin film silicon semiconductors includes depositing an amorphous semiconductor film by plasma CVD or low pressure CVD, and applying thereto thermal energy for a long duration of time (i.e., thermal annealing) for crystallization.

In general, silicon semiconductors need to be heated to a temperature of 600° C. or higher. More preferably, heating at 640° C. or higher is necessary to further enhance the crystal growth. However, such a high temperature heating has a problem of thermally influencing the substrate. Furthermore, since the heating time required for crystallization was several tens hours or longer, productivity was low. Therefore, it has been demanded to lower the heating temperature and shorten the heating time.

As a means to overcome the aforementioned problems, a process for crystallizing the film by increasing the surface temperature of the film to substantially 800° C. or higher has been developed. The process comprises irradiating an intense light such as an infrared radiation or a visible light for a duration of about 10 to 1,000 seconds to the surface of the film. This process, which is called as lamp annealing or rapid thermal annealing (RTA), is expected to be process for reducing the influence on substrates, because the duration of heating can be extremely shortened.

However, since the film formed by plasma CVD and low pressure CVD contains a lot of hydrogen combined with silicon, the decomposition reaction of hydrogen is mainly caused by RTA owing to the short time of RTA, that is, the crystallization does not sufficiently proceed. Furthermore, there is a problem that hydrogen is ejected to the exterior of the film by the decomposition reaction of hydrogen to degrade the morphology of the film surface. The present invention has been accomplished in the light of the above circumstances. Accordingly, an object of the present invention is to provide a silicon film suitable for forming a semiconductor device and having a sufficiently high crystallinity.

SUMMARY OF THE INVENTION

The process according to the present invention comprises a first step of forming a non-single crystal semiconductor film on a glass substrate and crystallizing the non-single crystal semiconductor film by a thermal annealing and the like to eject hydrogen from the non-single crystal semiconductor film and a second step of heating the non-single crystal semiconductor film by irradiating an intense light thereto (RTA process). Another step of forming, on the surface of said silicon film, an insulating coating which absorbs less than 10% of the intense light used in the second step may be incorporated between the first and the second steps. It is preferred in the present invention that the silicon film obtained by the first step has a low degree of crystallinity, more specifically the degree of crystallinity is 1 to 50%, more preferably 1 to 10%. The first step can be carried out by thermal annealing or other crystallizing methods.

There may be provided a step of patterning the silicon film into at least one island by etching.

As a substrate of this invention, it is preferable to utilize a glass substrate with strain point from 550° C. to 680° C. Specifically, No. 7059 of Corning Co. (strain point 593° C.), No. 1733 of the same (strain point 640° C.), LE30 of HOYA Co. (strain point 625° C.), NA35 (strain point 650° C.) of NH Technoglass Co., NA 45 (strain point 610° C.) of NH Technoglass Co., E-8 of OHARA Co. (strain point 643° C.), OA-2 of Nihon Denki Glass Co. (strain point 625° C.), AN1 (strain point 625° C.) of Asahi Glass Co., AN2 (strain point 625° C.) of Asahi Glass Co. and the like are desirable. However, a glass substrate other than above mentioned can be utilized, too.

Moreover, an insulating film such as silicon oxide, silicon nitride, or aluminum nitride can be formed on the surface of the glass substrate and an amorphous silicon film can be formed on it. In the case that a film of a material with high heat conductivity like aluminum nitride is formed on a glass substrate, the second step above mentioned can be omitted.

In case that the crystallizing in the first step above mentioned is carried out by thermal annealing, temperature and time of the thermal annealing is varied according to the thickness, composition and the like of the semiconductor thin film. In the case of substantially intrinsic silicon semiconductor, 520 to 620° C., for example, 550 to 600° C., and 1 to 4 hours is appropriate. It is preferable if the thermal annealing is performed at a temperature lower than the strain point of the glass substrate.

In addition, it is especially preferable if silicon ions have been implanted in the silicon film by an ion implanting method at a dose of $1\times10^{14}$ to $1\times10^{16}$ cm$^{-2}$ before the above-mentioned thermal annealing, because crystal growth by thermal annealing is suppressed.

Metal element promoting crystallization of the silicon film, e.g. nickel and the like, can be included in the silicon film obtained by the above-mentioned first step of the present invention. As a metal element other than nickel which can promote crystallization like this, Fe, Co, Ni, Ru, Rh, Pd, Os, Ir, Pt, Sc, Ti, V, Cr, Mn, Cu, Zn, Au, and Ag is known. In an amorphous silicon film added with these elements, crystallization proceeds enough even by low temperature short time thermal annealing of 520 to 620° C. and 1 to 4 hours. Crystal growth by RTA later has no effect if the crystallization proceeds excessively. Therefore, in the case of adding these metal elements, it is desirable if time of thermal annealing is shorter, or temperature of thermal annealing is lower, than that of the substantially intrinsic silicon film.

If these metal elements are included in the silicon film, it is also possible to crystallize the silicon film at a lower temperature in the process of RTA later. These metal elements also have an effect of promoting elimination (ejection) of hydrogen from the amorphous silicon film during thermal annealing. If silicon ions have been implanted to the silicon film as above mentioned before thermal annealing process, crystallization growth during thermal annealing can be suppressed, which is preferable, even if these metal elements are added.

These metal elements have great effects on semiconductor characteristic and reliability. A silicon film crystallized with including these metal elements at a large amount especially lacks in reliability-durability in the long run. To solve a problem like this, concentration of these metal elements existing in the Si film should be made effective in performing crystallization at a temperature needed, and will not take bad effects on the semiconductor character. Specifically, it is preferable if the minimum value of detection concentration is $1\times10^{15}$–$1\times10^{19}$ cm$^{-3}$ when concentration of these metal elements included in the silicon film is analyzed through the depth of the silicon film by secondary ion mass spectrometry (SIMS).

As a light to be utilized for RTA in the second step above mentioned, it is preferable if wavelength of the light to be utilized is absorbed in the silicon film but is not substantially absorbed to the glass substrate. That is, it is preferable if the center wavelength lies in the near infrared radiation or visible light. For example, a light with wavelength of 4 μm to 0.6 μm is desirable (e.g. infrared light having a peak at wavelength 1.3 μm). By irradiating intense light like this for relatively a short time like 10 to 1000 seconds, the silicon film can be heated and crystal character can be improved. It is desirable if the silicon film is heated at 800 to 1300° C.

If the silicon film is suddenly heated from a room temperature to a high temperature like this, or on the contrary if the silicon film is suddenly cooled from a high temperature like this to a room temperature, effect of stress and the like to be taken on the silicon film is big. Therefore preheat process to heat the film at a lower temperature than this high temperature, or post heat process to heat the silicon film at a temperature between this high temperature and the room temperature for a while in the course of descending temperature from the high temperature condition can be provided. To prevent heat damage on the substrate, it is preferable if temperature of the preheat process and the postheat process is lower than the strain point of the glass substrate by 50 to 200° C.

By thermal annealing in the first process, a nucleus of crystal growth is at least generated, and a low crystallized silicon film (crystallized area is 1 to 50%, preferably 1 to 10% (the rest is amorphous condition)) can be obtained even if the crystallization is suppressed. However, it is not preferred that a semiconductor device is formed by directly using the crystalline silicon film obtained by the first step. This is because there are left a lot of amorphous components mainly in the grain boundary and characteristic of the silicon film is not preferable in bulk and surface thereof. In the present invention, this silicon film is converted to a silicon film with good crystal character by RTA of the second process. By RTA, the silicon film is heated, and crystallinity of the crystallized silicon film is improved and the film is densified simultaneously. In this time, in case that the silicon film has a low crystallinity degree, crystallization can be expanded from the crystal nuclei formed by the first step to the surrounding amorphous region. In this case, since the crystallization proceeds relatively long distance, the effect of decreasing grain boundaries is obtained. By improving the crystallinity in this manner, the high quality silicon film with 90% or more thereof in area being crystallized can be obtained, which can be utilized for a thin film transistor (TFT).

However, in such RTA, temperature partially changes rapidly. Thus because of difference in thermal expansion coefficient between the silicon film and the substrate, and difference of temperature between the surface of the silicon film and the interface of the substrate and the silicon film, the silicon film is often peeled off. This is particularly notable in the case that the area of the film is so big that it covers the whole surface of the substrate. Therefore, peeling and the like of the film can be prevented by dividing the film in sufficiently small areas, and by making distances between the divided films sufficiently wide so that unnecessary heat would not be absorbed by the substrata. In this way, because the whole surface of the substrate will not be heated through the silicon film, thermal shrinkage of the substrate is suppressed mostly.

In the present invention, it is preferred that light with wavelength of 0.6 to 4 μm is irradiated to the silicon film formed on the glass substrate in the second step (RTA). This wavelength is efficiently absorbed to a low crystallized intrinsic or substantially intrinsic (concentration of phosphorous or boron is $10^{17}$ cm$^{-3}$ or less) silicon film, and is converted to heat. Far infrared light with wavelength of 10 μm or more is absorbed to the glass substrate and heats the glass substrate. However, in the case that wavelength of far infrared light is mostly 4 μm or less, absorption by the glass is 0.01 to 10%. Thus heating of the glass is extremely small. That is, to crystallize a silicon film with low crystal character and not to take great effect on the substrate, wavelength of 0.6 to 4 μm is appropriate.

DETAILED DESCRIPTION OF THE INVENTION

EXAMPLE 1

Figure 1A:
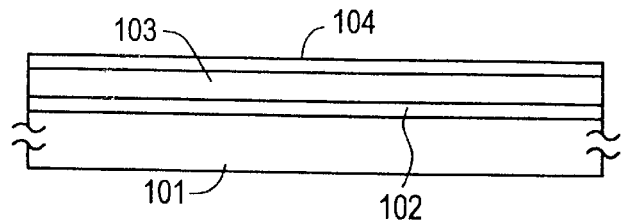
FIGS. 1(A) to 1(D) show the step-sequential schematically drawn views for the structures obtained in a process for fabricating a TFT according to Example 1 of the present invention.
Figure 1B:
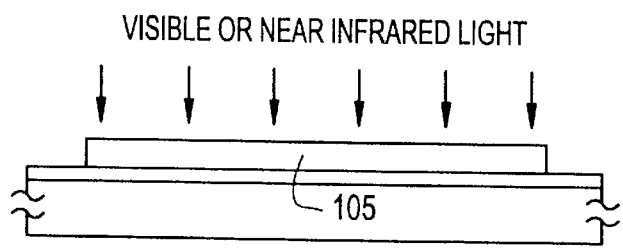
Figure 1C:
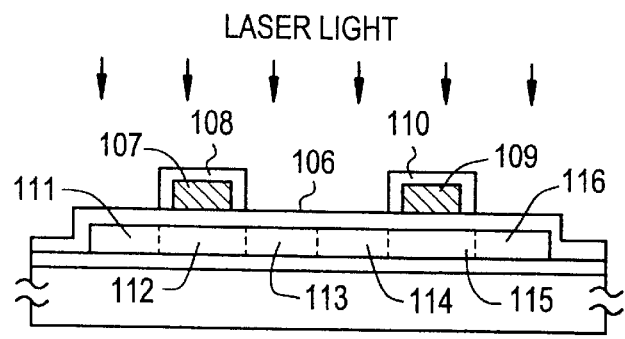
Figure 1D:
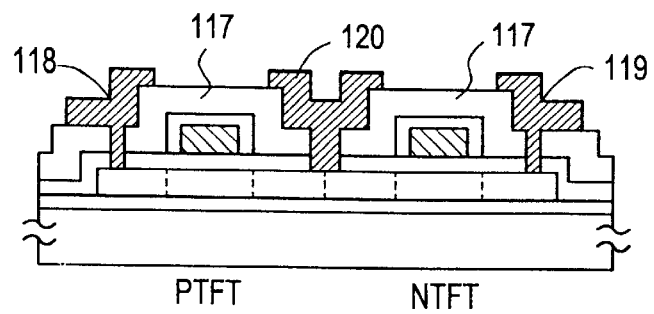
Figure 2A:
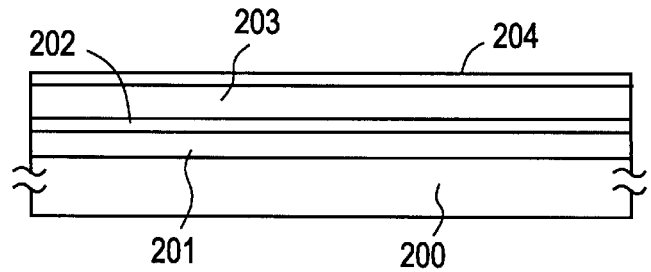
FIGS. 2(A) to 2(D) show the step-sequential schematically drawn views for the structures obtained in a process for fabricating a TFT according to Example 2 of the present invention.
Figure 2B:
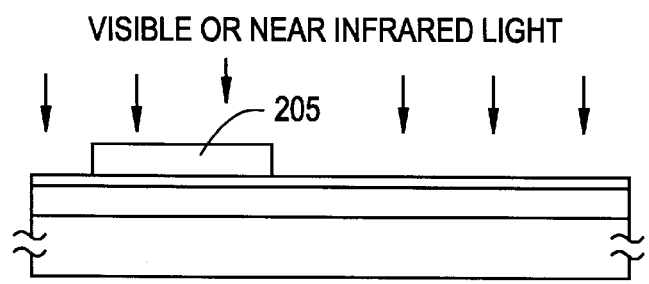
Figure 2C:
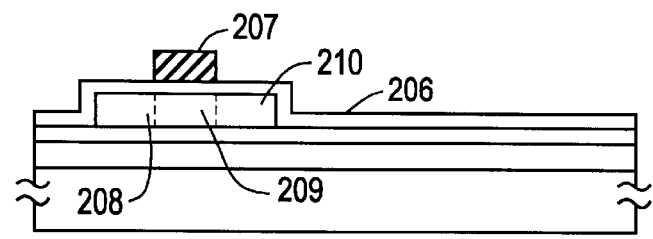
Figure 2D:
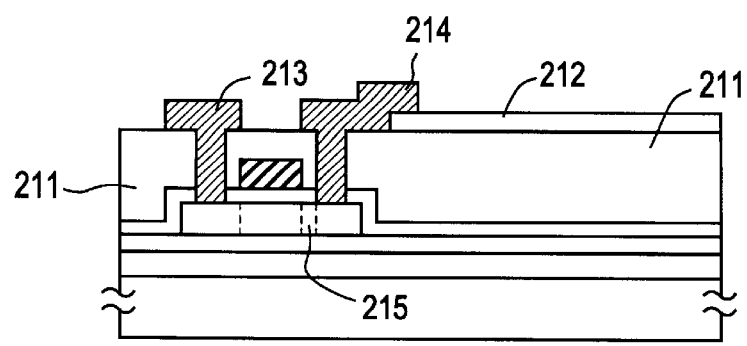

Referring to FIGS. 1(A) to 1(D), the present example relates to a process for fabricating a circuit comprising a p-channel TFT (hereinafter referred to simply as a "PTFT") and an n-channel TFT (hereinafter referred to simply as an "NTFT") formed in a complementary arrangement using a crystalline silicon film formed on a glass substrate. The structure obtained in the present example is applicable to switching elements of pixel electrodes and to peripheral driver circuits of active liquid crystal display devices, as well as to image sensors and three-dimensional integrated circuits.

Referring to the cross section views in FIGS. 1(A) to 1(D), the fabrication process of the present example is described below. A 2,000 Å thick silicon oxide film was deposited as a base film 102 on the surface of a Corning 7059 glass substrate 101 by a sputtering process. Mask alignment in the later steps can be facilitated by annealing the substrate either before or after depositing the base film at a temperature higher than the deformation temperature (strain point) of the glass substrate, and then gradually cooling it to the deformation temperature (strain point) or lower at a rate of 0.1 to 1.0° C./min. In case of a Corning 7059 substrate, more specifically, the substrate is preferably subjected to a pretreatment comprising an annealing for a duration of from 1 to 4 hours in the temperature range of from 620 to 660° C. and a gradual cooling to a temperature in the range of from 400 to 500° C. at a rate of from 0.1 to 1.0° C./min, preferably, at a rate of from 0.03 to 0.3° C./min.

An intrinsic (I-type) amorphous silicon film 103 was deposited thereafter by plasma CVD at a thickness of from 300 to 1,500 Å, for example, 800 Å. A silicon oxide film 104 was deposited thereon by plasma CVD at a thickness of from 100 to 800 Å, for instance, at a thickness of 200 Å. This amorphous silicon film functions as a protective film to prevent surface roughening from occurring on the silicon film in the subsequent step of thermal annealing.

The resulting structure was thermally annealed at 600° C. for a duration of 4 hours under 1 atm in a nitrogen atmosphere. Hydrogen atoms that are incorporated in excess in the silicon film can be discharged by thermal annealing to provide a film with low crystallinity. However, in contrast to a polycrystalline silicon film comprising 90% or more of crystallized silicon, no peak assigned to crystalline silicon was discernible upon analyzing the silicon film by Raman scattering spectroscopy. Thus, the film obtained by annealing is presumably a film in which at least nucleation is completed, and in which crystallization had occurred over 50% or less in area, generally, from 1 to 10% in area. TEM (transmission electron microscope) observation revealed the presence of fine crystals of 1,000 Å or less, typically, from 20 to 100 Å in size. Crystals must be grown to 3 to 30 times in size, and the crystal growth was found to occur accelerated in the silicon film by previously introducing silicon ions at a dose of from $1\times10^{14}$ to $1\times10^{16}$ cm$^{-2}$ by ion implantation (FIG. 1(A)).

The silicon film was patterned by etching thereafter to form island-like active layer 105 for the TFT. The size of the active layer 105 is determined considering the channel length and the channel width. The active layers thus formed range from the smaller ones 50 μm×20 μm in size to the larger ones 100 μm×1,000 μm in size.

Then, the active layer was crystallized by irradiating thereto an infrared radiation having a peak in a wavelength range of from 0.6 to 4 μm, for example, in a wavelength range of from 0.8 to 1.4 μm in this case, for a duration of from 30 to 180 seconds. The temperature during the irradiation of an infrared radiation was kept in the range of from 800 to 1,300° C., representatively, in the range of from 900 to 1,200° C, for example, 1,100° C. in this case. The surface characteristics of the active layer can be further ameliorated by irradiating the infrared radiation under a hydrogen atmosphere. Since the active layer is selectively heated in the present step, the thermal influence on the glass substrate can be minimized. The present invention is particularly effective for reducing the dangling bonds and defects in the active layer (FIG. 1(B)).

A halogen lamp was utilized for a light source of the infrared radiation. The intensity of a visible or a near infrared light was controlled as such that the temperature on the single crystal silicon wafer provided as a monitor is to be in the range of from 800 to 1,300° C., representatively, in the range of from 900 to 1,200° C. More specifically, the temperature of the silicon wafer was monitored with a built-in thermocouple, and the result was fed back to the light source of the infrared radiation. The surface temperature of the silicon on a glass substrate is assumably lowered to about two-thirds of the monitored temperature. In the present invention, the temperature was raised and lowered in such a manner as illustrated in FIG. 4 (A) or 4(B). The temperature was raised at a constant rate of from 50 to 200° C./sec, and lowered by air cooling at a rate ranging from 20 to 100° C./sec.

Figure 4A:
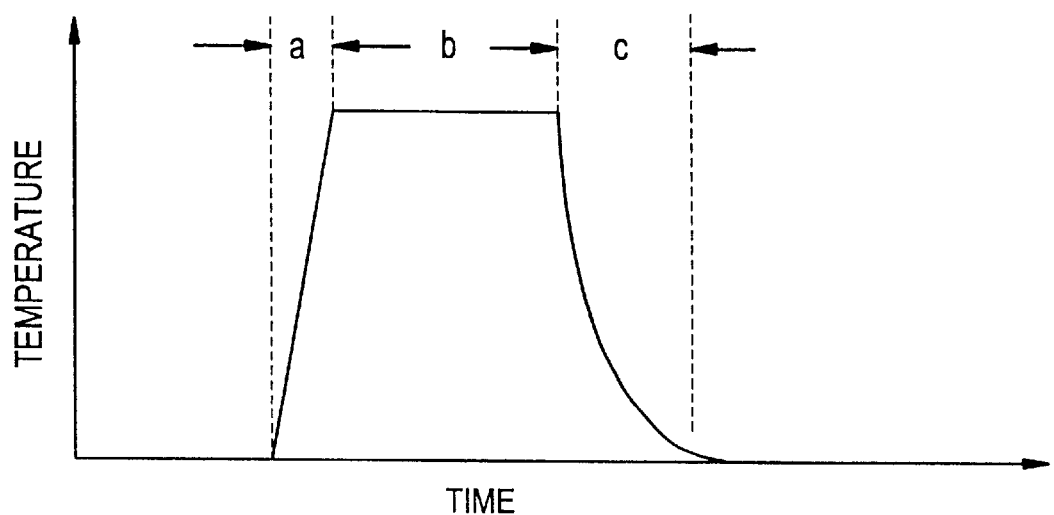
FIG. 4A is a heating cycle comprising a heating time, a holding time, and a cooling time.

The temperature control illustrated in FIG. 4(A) is a general heating cycle comprising three steps, i.e., a heating time a, a holding time b, and a cooling time c. It can be seen that the specimen is rapidly heated up from a room temperature to a temperature as high as 1,000° C., and that is cooled down from the high temperature to a room temperature, which greatly influences the silicon film and the substrate, thereby increasing possibility of causing separation between the silicon film and the substrate.

Figure 4B:
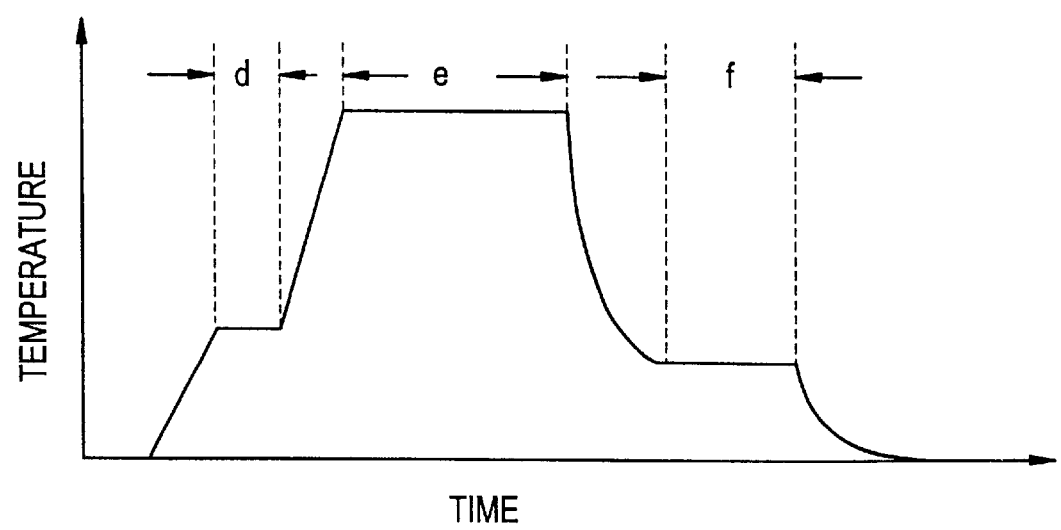
FIG. 4B is a heating cycle comprising a pre-heating time, a holding time, and a post-heating time.

The aforementioned problem can be overcome by providing a pre-heating time d or a post-heating time f before or after the holding time as shown in FIG. 4(B). The pre-heating time or the post-heating time holds the structure in the temperature range that is lower than the strain point of the glass substrate by 50 to 200° C, e.g. from 400 to 700° C., preferably in the range of from 500 to 600° C., to prevent causing damage to the substrate and to the film thereon. 30 seconds to 30 minutes are preferable as the pre-heating time and the post-heating time. In the case where a substrate having a large area of, e.g., 300×400 mm² or 400×600 mm², is used, the pre-heating or post-heating is preferably effected at such a temperature which realizes a uniform temperature over the substrate without causing local thermal expansion or shrinking.

In case of irradiating a visible or infrared radiation, a silicon oxide film or a silicon nitride film is preferably formed as a protective film on the surface of the silicon film. The film provides a silicon film 105 having a surface of improved quality. In the present example, the irradiation was carried out under a hydrogen atmosphere to improve the surface characteristics of the silicon film. However, the irradiation can be carried out under a hydrogen atmosphere added therein from 0.1 to 10% by volume of hydrogen chloride or other hydrogen halides as well as compounds of chlorine or bromine.

The irradiation of a visible light or a near infrared light is effected for selectively heating the crystallized silicon film. Thus, the thermal influence on the glass substrate during this step can be minimized. Furthermore, this step is particularly effective for reducing the defects and dangling bonds that are present in the silicon film. Moreover, after the RTA process, it is also effective to anneal the structure in hydrogen in the temperature range of from 200 to 500° C., representatively, at 350° C., for reducing the defects. The same effect can be obtained by ion doping hydrogen at a dose of from $1\times10^{13}$ to $1\times10^{15}$ cm$^{-2}$ and heat treating the structure thereafter in the temperature range of from 200 to 300° C.

A 1,000 Å thick silicon oxide film 106 as a gate insulating film was deposited by plasma CVD after the RTA process. The plasma CVD process was effected using tetraethoxysilane (TEOS; $Si(OC_2H_5)_4$) and oxygen as the starting gases while maintaining the substrate in the temperature range of from 300 to 550° C., for example, at 400° C.

Photo annealing was effected again after depositing the silicon oxide film 106 as the gate insulating film. The annealing was effected in the same manner as in the previous RTA process using a visible or a near infrared light. The levels at the boundary between the silicon oxide film 106 and the silicon film were found to disappear by the present annealing process. It can be seen that this step is extremely effective for an insulated-gate field effect semiconductor device in which the boundary characteristics between the gate insulating film and the channel forming region are particularly important.

Succeedingly, an aluminum film (containing from 0.01 to 0.25% of a rare earth element selected from Group IIIa elements of the Periodic Table) was deposited by sputtering at a thickness of from 6,000 to 8,000 Å, for example, at a thickness of 6,000 Å. The aluminum film was patterned by etching to form gate electrodes 107 and 109. The surface of the aluminum film was anodically oxidized thereafter to form oxide layers 108 and 110 on the surface thereof. The surface oxidation was effected in an ethylene glycol solution containing from 1 to 5% of tartaric acid. The thickness of the oxide layers 108 and 110 thus obtained were each 2,000 Å, respectively. The thickness of the oxide layers 108 and 110 are provided as such to determine the thickness of the offset gate region to be formed in the later step of ion doping.

Next, impurities for imparting a region either P- or N-conductive were introduced in a self-aligned manner by means of ion doping process (plasma doping process) into the silicon film 105 by using the gate electrode portions (i.e., the gate electrode 107 and the peripheral oxide layer 108, as well as the gate electrode 109 and the peripheral oxide layer 110) as the mask. Phosphine ($PH_3$) and diborane ($B_2H_6$) were used as the doping gases. The dose was from $1\times10^{15}$ to $8\times10^{15}$ cm$^{-2}$. Thus, in case phosphine is used, phosphorus is introduced at a dose of, more specifically $2\times10^{15}$ cm$^{-2}$, while applying an accelerating voltage of from 60 to 90 kV, for example, a voltage of 80 kV. In case diborane is used, boron is introduced at a dose of $5\times10^{15}$ cm$^{-2}$ while applying an accelerating voltage of from 40 to 80 kV, for instance, a voltage of 65 kV. The regions were selectively doped with the respective elements by covering the other region with a photoresist. Thus, N-type impurity regions 114 and 116, and p-type impurity regions 111 and 113 were obtained to form a region for a p-channel TFT (PTFT) and region for an n-channel TFT (NTFT).

The regions were then annealed by irradiating a laser beam. A KrF excimer laser operating at a wavelength of 248 nm and at a pulse width of 20 nsec was used in the present invention. However, the type of the laser is not limited thereto. The laser beam was irradiated from 2 to 10 shots per site, for example, 2 shots per site, at an energy density of from 200 to 400° mJ/cm$^2$, for instance, at 250 mj/cm$^2$. The effect of laser annealing can be further enhanced by heating the substrate in the temperature range of from about 200 to 450° C. (FIG. 1(C)).

Further, the step above can be effected otherwise by RTA, i.e. by irradiating a visible or near infrared radiation. A visible light or a near infrared radiation can be easily absorbed by crystallized silicon or amorphous silicon added therein from $10^{17}$ to $10^{21}$ cm$^{3-}$phosphorus or boron. Thus, an effective annealing well comparable to thermal annealing effected at 1,000° C. or higher can be realized. The addition of phosphorus or boron atoms accelerates the absorption of a radiation by impurity scattering effect. Accordingly, a near infrared light can be sufficiently absorbed by the silicon film. This phenomena can be easily assumed by the black-colored opaque appearance of the film. However, a radiation in the visible to the near infrared region is less absorbed by the glass substrate. Thus, the silicon film can be readily annealed in a short time without heating the glass substrate to a high temperature. This process can be said ideal for a case in which the shrinkage of a glass substrate is found problematic.

A 6,000 Å thick silicon oxide film 117 was deposited by plasma CVD thereafter as an interlayer dielectric. The interlayer dielectric may be made from a polyimide film or a double-layered film of silicon oxide and polyimide. Contact holes were formed thereafter to establish electrodes/ wirings 118, 120, and 119 of TFT using a metallic material, for example, a multilayered film of titanium nitride and aluminum. Lastly, a semiconductor circuit comprising the TFTs in a complementary arrangement was obtained by finally annealing the structure at a temperature of 350° C. for a duration of 30 minutes under a hydrogen gas atmosphere at a pressure of 1 atm (FIG. 1(D)).

In the process according to the present invention, it is particularly important to add hydrogen to the dangling bonds formed during the RTA using a visible light or a near infrared radiation. This can be accomplished by heating the structure in hydrogen at a temperature in the range of from 250 to 400° C. in a step subsequent to that of RTA. Thus, the process according to the present invention provides an improved productivity, a TFT which yields a leak current (off current) reduced by two to three digits as compared with a TFT fabricated by a prior art process. The leak current in this case signifies a leak current which generates when zero voltage or a reversed bias voltage (negative voltage in case of an NTFT) is applied to the gate electrode.

The circuit thus obtained has a CMOS construction with a PTFT and an NTFT provided in a complementary arrangement, however, it is also possible to fabricate two independent TFTs by forming two TFTs simultaneously according to the process steps above, and separating them at the center.

EXAMPLE 2

The present example relates to an active-matrix type liquid crystal display device having N-channel TFTs (NTFTs) each attached as a switching element to each of the pixels. The following description refers to a single pixel only, however, a practical active-matrix type liquid crystal device comprises a great number (generally several hundred thousands) of pixels all having the same structure simultaneously. Furthermore, the TFT not necessarily be an NTFT, and a PTFT can be employed as well. The TFT need not be provided to the pixel portion of the liquid crystal display, and it can be used in the peripheral circuits. Moreover, it can be used in image sensors and in other devices. In short, the application is not limited as long as it is used as a thin film transistor.

Referring to the step sequential structures shown in FIGS. 2(A) to 2(D), the process for fabricating the structure according to an embodiment of the present invention is described below. A 2,000 Å thick film of aluminum nitride was deposited by sputtering as a base film 201 on a NA45 glass substrate 200 having a thickness of 1.1 mm and an area of 300×400 mm$^2$ and a strain point of 610° C, and a silicon oxide film 202 was further deposited thereon by plasma CVD at a thickness of 2,000 Å as another base film. Aluminum nitride has a high thermal conductivity ten times as high as that of a glass substrate or even higher. Accordingly, the aluminum nitride film deposited on the substrate was found favorable for maintaining the temperature of the entire substrate uniform. Furthermore, the adhesiveness of the aluminum nitride film to the glass substrate can be increased by adding from 0.01 to 20% by atomic of oxygen to the aluminum nitride film with respect to nitrogen, thereby bringing the thermal expansion coefficient of aluminum nitride film nearer to that of the glass substrate.

The aluminum nitride film can be deposited by plasma CVD using trimethylaluminum (Al(CH$_3$)$_3$) and ammonia as the starting materials. Otherwise, the aluminum nitride film can be deposited by means of reactive sputtering in a nitrogen or ammonia atmosphere using an aluminum target. The silicon oxide film 202 was deposited by CVD using TEOS and oxygen as the starting materials. A 1,000 Å thick amorphous silicon film 203 and a 200 Å thick silicon oxide film 204 were each deposited thereafter by LPCVD or plasma CVD. The resulting structure was heated at 550° C. for annealing for a duration of 1 hour (FIG. 2(A)).

After the step of thermal annealing, the silicon film was patterned by etching to leave only an island-like active layer 205 alone for the TFT. A visible light or a near infrared radiation was irradiated thereafter to the island-like active layer 205 to improve the crystallinity thereof. Thus, annealing was effected at 1,100° C. for a duration of 30 seconds. Since the aluminum nitride film assures a uniform thermal conduction in the silicon film, the patterning by etching can be otherwise effected after irradiating a visible light or a near infrared radiation (FIG. 2(B)).

A gate insulating film 206 of a silicon oxide was deposited thereafter at a thickness of from 700 to 1800 Å, typically at a thickness of 1200 Å, by plasma CVD under an oxygen atmosphere using TEOS (tetra ethoxy silane) as the starting material. The temperature of the substrate was kept at 350° C. Then, a film containing polycrystalline silicon as the principal component was formed by LPCVD and patterned by etching to obtain a gate electrode 207. Phosphorus was incorporated into the polycrystalline silicon as an impurity at an amount of from 0.1 to 5% by atomic to improve the electric conductivity thereof.

Then, phosphorus was incorporated as an impurity by ion doping to render the impurity-doped portion N-type conductive. Thus, a source region 208, a channel forming region 209, and a drain region 210 were formed in a self-aligned manner. Laser beam was irradiated to the silicon film thereafter using a KrF laser to improve the crystallinity of the film which was damaged by ion implantation. A this time, the laser beam was irradiated at an energy density of from 250 to 300 mJ/cm$^2$. The sheet resistance of the source/drain of the TFT was found to be in the range of from 300 to 800Ω/cm$^2$. In case of forming a lightly doped drain (LDD) 215 structure comprising impurities at a lower concentration, the sheet resistance falls in the range of from 10 to 200Ω/square. The annealing can be effected by lamp annealing using a visible light or a near infrared radiation instead of irradiating a laser beam (FIG. 2(C)).

Thereafter, an interlayer dielectric 211 was formed using silicon oxide or polyimide. Furthermore, a pixel electrode 212 was formed using ITO (indium tin oxide). Contact holes were formed thereafter to establish electrodes 213 and 214 for the source/drain regions of the TFT using a multilayered film of chromium and aluminum. One of the electrodes 214 was connected to the ITO 212. Finally, the resulting structure was annealed in hydrogen for a duration of 2 hours in the temperature range of from 200 to 400° C. to obtain a complete TFT. This step is effected simultaneously on a plurality of pixel regions. Furthermore, a passivation film may be formed on the entire surface using silicon nitride and the like to improve the moisture resistance of the TFT (FIG. 2(D)).

The pixel transistors for active matrices described above in the present example need not to be operated at a high speed. In this example, accordingly, the duration of the first thermal annealing step was shortened to 1 hour. Thus, the crystallinity of the silicon film obtained in the present example was found inferior to that of the one obtained in Example 1. Nevertheless, sufficient static characteristic and dynamic characteristic were obtained as a switching transistor of the active-matrix circuit.

EXAMPLE 3

Referring to FIGS. 3(A) to 3(E), a process for fabricating a TFT circuit according to an embodiment of the present invention is described below. A substrate of a glass having a strain point in the range of from 550 to 650° C., such as an AN2 glass substrate having a strain point of 616° C., was used.

To prevent shrinking from occurring, the substrate was subjected previously to pre-annealing at 670° C. for a duration of 4 hours and to cooling to 450° C. at a rate of 0.1° C./min in a manner similar to that in Example 1. A base film 302 was formed on the substrate 301, and an amorphous silicon film 303 having thickness from 300 to 800 Å and a 200 Å thick silicon oxide film 304 were deposited thereafter by plasma CVD. The resulting structure was heated for annealing at 620° C. for a duration of 30 minutes. After the thermal annealing, the substrate was rapidly cooled to 450° C. at a rate of from 2 to 200° C./sec, preferably, at a rate of 10° C./sec or higher. This treatment prevents the substrate from shrinking during thermal annealing. In case an annealing furnace not suitable for rapid cooling is employed, the substrate may be taken out from the furnace and placed in the ambient temperature to obtain a similar effect as described above. Furthermore, although AN2 was used as a substrate in EXAMPLE 3, other glass substrate having a strain point of 550 to 680° C., e.g. Corning 1733 (strain point 640° C.) and LE30 (strain point 625° C.) may be used instead.

The substrate was subjected to a thermal annealing at a temperature higher than those of Examples 1 and 2, and yet, at a temperature higher than the strain point (616° C.) of AN2 glass. Accordingly, it was difficult to suppress the shrinking of the substrate even though a heat treatment and cooling were effected beforehand on the substrate. Rapid cooling from the annealing temperature was found effective in such a case (FIG. 3(A)).

The silicon film 303 was patterned by etching thereafter to form island-like active regions 306 and 307. The active layer was etched by RIE (reactive ion etching) having an anisotropy along the perpendicular direction (FIG. 3(B)).

A silicon oxide film or a silicon nitride film 307 was deposited thereafter to a thickness of from 200 to 3,000 Å by plasma CVD. Otherwise, a silicon nitride film can be formed by low pressure CVD or photo CVD. Then, similar to the case in Example 1, RTA treatment was effected using a visible light or a near infrared radiation. The conditions for the RTA treatment were the same as those used in Example 1. In the present case, a protective film of silicon oxide or silicon nitride thus formed over the surface of the active layer prevented roughening or staining from occurring on the surface of the active layer on irradiating a visible light or a near infrared radiation (FIG. 3(C)).

The protective film 307 was removed after the step of irradiating a visible light or a near infrared radiation. Then, a gate insulating film 308, and gate electrodes 309 and 310 were formed in the same manner as in Example 1, and an impurity region was formed thereafter by ion doping. The impurity region thus obtained was activated by irradiating a laser beam thereto (FIG. 3(D)).

Figure 3A:
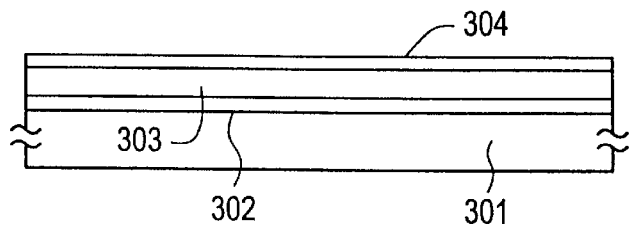
FIGS. 3(A) to 3(E) show the step-sequential schematically drawn views for the structures obtained in a process for fabricating a TFT according to Example 3 of the present invention.
Figure 3B:
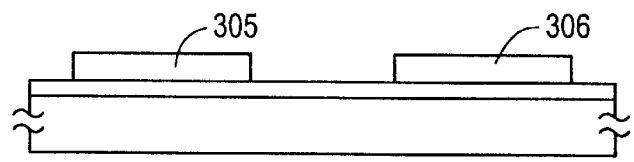
Figure 3C:
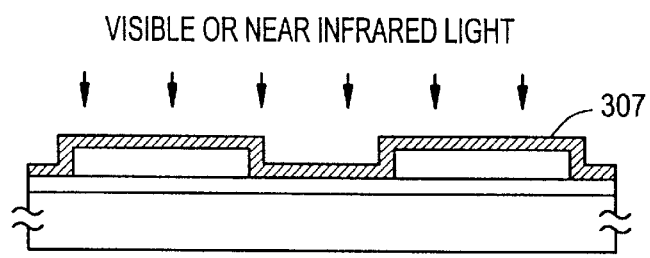
Figure 3D:
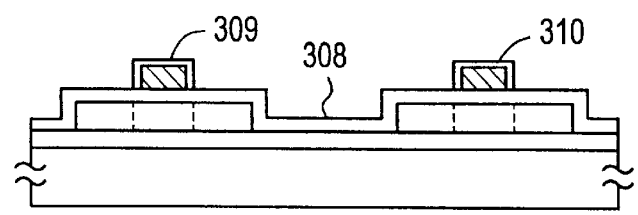
Figure 3E:
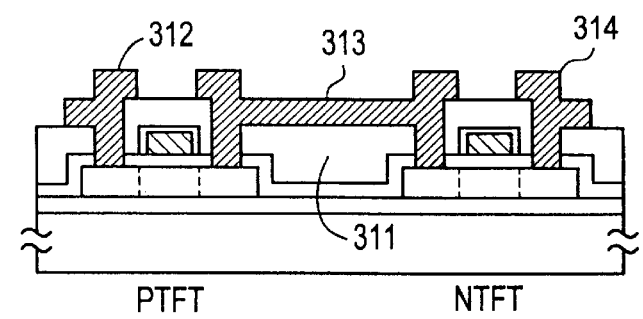

After forming an interlayer dielectric 311, contact holes were formed to establish metallic wirings 312, 313, and 314 (FIG. 3(E)).

Thus, a complementary TFT circuit was obtained. The present example is characterized in that the surface roughening or staining is prevented from occurring on the surface of the active layer by forming a protective film on the surface of the active layer upon irradiating a visible light or a near infrared radiation. Thus, the semiconductor characteristics (e.g., an electric field mobility and a threshold voltage) as well as reliability were found to be excellent. Furthermore, as described above, the process according to the present invention was particularly effective on substrate materials having a glass transition temperature (strain point) in the temperature range of from 550 to 680° C.

By additionally irradiating an intense light of a wavelength corresponding to visible or near infrared light to the silicon film crystallized by thermal annealing and the like, crystallinity of the silicon film can be improved and the silicon film can be densified simultaneously to obtain a silicon film having a good crystallinity. In case of employing thermal annealing particularly, the temperature is preferably 520 to 620° C., more preferably 550 to 600° C., and the time is preferably 1 to 4 hours.

Further, in order to improve characteristic of the gate insulating film, after an insulating film is formed on the crystalline silicon film obtained by the present invention, the crystalline silicon film may be annealed by irradiating thereto a light having a wavelength corresponding to visible light or near infrared radiation in dinitrogen monoxide ($N_2O$) or ammonia. By this annealing, interface level can be reduced. Furthermore, after these steps, hydrogen may be added in the silicon film to neutralize or eliminate dangling bonds by hydrogenation annealing at 200 to 450° C. in hydrogen atmosphere.

In case that thermal annealing is employed in the present invention, the time required for the thermal annealing is largely shortened to 4 hours or shorter from several tens hours required conventionally. Since the annealing time is shorter than before, influence on the substrate by the annealing step is sufficiently small. Furthermore, wavelength of the light used in the lator RTA process is 0.6 to 4 µm. Even if glass material is used for the substrate, since the substrate is cooled rapidly, the substrate is not soften and is not shrunk and is not transformed to an industrially unusable degree. Thus, the present invention is industrially useful and particularly the present invention is extremely effective for forming an insulated gate semiconductor device.

While the invention has been described in detail and with reference to specific embodiments thereof, it will be apparent to one skilled in the art that various changes and modifications can be made therein without departing from the spirit and scope thereof.

What is claimed is:

1. A display device comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a part of said pixel electrode.

2. A display device comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode.

3. A display device comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a part of said pixel electrode, wherein said lightly doped drain has a sheet resistance of 10 to 200KU/square.

4. A display device comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200KU/square.

5. A liquid crystal display comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a part of said pixel electrode.

6. A liquid crystal display comprising:

a glass substrate;

an insulating film comprising aluminum nitride containing from 0.01 to 20% by atomic of oxygen therein with respect to nitrogen, said insulating film being provided on said glass substrate:

a source region and a drain region provided over said insulating film;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode.

7. A liquid crystal display comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a part of said pixel electrode, wherein said lightly doped drain has a sheet resistance of 10 to 200K U/square.

8. A liquid crystal display comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200KÜ/square.

9. The device of claim 1 wherein said transparent organic film comprises polyimide.

10. The device of claim 2 wherein said transparent organic film comprises polyimide.

11. The device of claim 3 wherein said transparent organic film comprises polyimide.

12. The device of claim 4 wherein said transparent organic film comprises polyimide.

13. The display of claim 5 wherein said transparent organic film comprises polyimide.

14. The display of claim 6 wherein said transparent organic film comprises polyimide.

15. The display of claim 7 wherein said transparent organic film comprises polyimide.

16. The display of claim 8 wherein said transparent organic film comprises polyimide.

17. The device of claim 1 wherein said pixel electrode comprises a transparent pixel electrode.

18. The device of claim 2 wherein said pixel electrode comprises a transparent pixel electrode.

19. The device of claim 3 wherein said pixel electrode comprises a transparent pixel electrode.

20. The device of claim 4 wherein said pixel electrode comprises a transparent pixel electrode.

21. The display of claim 5 wherein said pixel electrode comprises a transparent pixel electrode.

22. The display of claim 6 wherein said pixel electrode comprises a transparent pixel electrode.

23. The display of claim 7 wherein said pixel electrode comprises a transparent pixel electrode.

24. The display of claim 8 wherein said pixel electrode comprises a transparent pixel electrode.

25. The device of claim 1 wherein said substrate comprises an insulating substrate.

26. The device of claim 2 wherein said substrate comprises an insulating substrate.

27. The device of claim 3 wherein said substrate comprises an insulating substrate.

28. The device of claim 4 wherein said substrate comprises an insulating substrate.

29. The display of claim 5 wherein said substrate comprises an insulating substrate.

30. The display of claim 6 wherein said substrate comprises an insulating substrate.

31. The display of claim 7 wherein said substrate comprises an insulating substrate.

32. The display of claim 8 wherein said substrate comprises an insulating substrate.

33. The device of claim 1 wherein said transparent organic film provides a leveled upper surface over said source region and said drain region and said channel forming region and said gate insulating film and said gate electrode.

34. The device of claim 2 wherein said transparent organic film provides a leveled upper surface over said source region and said drain region and said channel forming region and said gate insulating film and said gate electrode.

35. The device of claim 3 wherein said transparent organic film provides a leveled upper surface over said source region and said drain region and said channel forming region and said gate insulating film and said gate electrode.

36. The device of claim 4 wherein said transparent organic film provides a leveled upper surface over said source region and said drain region and said channel forming region and said gate insulating film and said gate electrode.

37. The display of claim 5 wherein said transparent organic film provides a leveled upper surface over said source region and said drain region and said channel forming region and said gate insulating film and said gate electrode.

38. The display of claim 6 wherein said transparent organic film provides a leveled upper surface over said source region and said drain region and said channel forming region and said gate insulating film and said gate electrode.

39. The display of claim 7 wherein said transparent organic film provides a leveled upper surface over said source region and said drain region and said channel forming region and said gate insulating film and said gate electrode.

40. The display of claim 8 wherein said transparent organic film provides a leveled upper surface over said source region and said drain region and said channel forming region and said gate insulating film and said gate electrode.

41. The device of claim 1 wherein said pixel electrode comprises an indium tin oxide.

42. The device of claim 2 wherein said pixel electrode comprises an indium tin oxide.

43. The device of claim 3 wherein said pixel electrode comprises an indium tin oxide.

44. The device of claim 4 wherein said pixel electrode comprises an indium tin oxide.

45. The display of claim 5 wherein said pixel electrode comprises an indium tin oxide.

46. The display of claim 6 wherein said pixel electrode comprises an indium tin oxide.

47. The display of claim 7 wherein said pixel electrode comprises an indium tin oxide.

48. The display of claim 8 wherein said pixel electrode comprises an indium tin oxide.

49. A liquid crystal display having an active matrix region, said active matrix region comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said insulating film between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film; and an electrode connected with one of said source region and said drain region through said contact hole and connected with said pixel electrode and provided over at least a side edge part of said pixel electrode.

50. A liquid crystal display having an active matrix region, said active matrix region comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200KΩsquare.

51. A liquid crystal display having an active matrix region, said active matrix region comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said insulating film between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200KΩsquare.

52. A liquid crystal display having an active matrix region, said active matrix region comprising:

a substrate;

a source region and a drain region provided over said substrate;

a channel forming region provided over said substrate between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200KΩsquare, and wherein said source region and said drain region have a sheet resistance of 300 to 800Ωsquare.

53. A liquid crystal display having an active matrix region, said active matrix region comprising:

a glass substrate;

an insulating film comprising aluminum nitride containing from 0.01 to 20% by atomic of oxygen therein with respect to nitrogen, said insulating film being provided on said glass substrate;

a source region and a drain region provided over said insulating film;

a channel forming region provided over said insulating film between said source region and said drain region;

a gate electrode provided adjacent to said channel forming region with a gate insulating film therebetween;

a transparent organic film provided over said source region and said drain region and said channel forming region and said gate insulating film and said gate electrode;

a pixel electrode provided over said transparent organic film;

a contact hole provided in said transparent organic film;

a lightly doped drain provided between said channel forming region and said drain region; and an electrode connected with one of said source region and said drain region through said contact hole and connected with said pixel electrode and provided over at least a side edge part of said pixel electrode, wherein said lightly doped drain has a sheet resistance of 10 to 200 KΩsquare, and wherein said source region and said drain region have a sheet resistance of 300 to 800Ωsquare.

54. The device of claim 1 wherein said source region and said drain region and said channel forming region are provided in a semiconductor film comprising a silicon and an element promoting crystallization of said semiconductor film.

55. The device of claim 54 wherein said element is selected from the group consisting of Ni, Fe, Co, Ru, Rh, Pd, Os, Ir, Pt, Sc, Ti, V, Cr, Mn, Cu, Zn, Au and Ag.

56. The device of claim 2 wherein said source region and said drain region and said channel forming region are provided in a semiconductor film comprising a silicon and an element promoting crystallization of said semiconductor film.

57. The device of claim 56 wherein said element is selected from the group consisting of Ni, Fe, Co, Ru, Rh, Pd, Os, Ir, Pt, Sc, Ti, V, Cr, Mn, Cu, Zn, Au and Ag.

58. The device of claim 3 wherein said source region and said drain region and said channel forming region are provided in a semiconductor film comprising a silicon and an element promoting crystallization of said semiconductor film.

59. The device of claim 58 wherein said element is selected from the group consisting of Ni, Fe, Co, Ru, Rh, Pd, Os, Ir, Pt, Sc, Ti, V, Cr, Mn, Cu, Zn, Au and Ag.

60. The device of claim 4 wherein said source region and said drain region and said channel forming region are provided in a semiconductor film comprising a silicon and an element promoting crystallization of said semiconductor film.

61. The device of claim 60 wherein said element is selected from the group consisting of Ni, Fe, Co, Ru, Rh, Pd, Os, Ir, Pt, Sc, Ti, V, Cr, Mn, Cu, Zn, Au and Ag.

62. The display of claim 5 wherein said source region and said drain region and said channel forming region are provided in a semiconductor film comprising a silicon and an element promoting crystallization of said semiconductor film.

63. The display of claim 62 wherein said element is selected from the group consisting of Ni, Fe, Co, Ru, Rh, Pd, Os, Ir, Pt, Sc, Ti, V, Cr, Mn, Cu, Zn, Au and Ag.

64. The display of claim 6 wherein said source region and said drain region and said channel forming region are provided in a semiconductor film comprising a silicon and an element promoting crystallization of said semiconductor film.

65. The device of claim 64 wherein said element is selected from the group consisting of Ni, Fe, Co, Ru, Rh, Pd, Os, Ir, Pt, Sc, Ti, V, Cr, Mn, Cu, Zn, Au and Ag.

66. The display of claim 7 wherein said source region and said drain region and said channel forming region are provided in a semiconductor film comprising a silicon and an element promoting crystallization of said semiconductor film.

67. The display of claim 66 wherein said element is selected from the group consisting of Ni, Fe, Co, Ru, Rh, Pd, Os, Ir, Pt, Sc, Ti, V, Cr, Mn, Cu, Zn, Au and Ag.

68. The display of claim 8 wherein said source region and said drain region and said channel forming region are provided in a semiconductor film comprising a silicon and an element promoting crystallization of said semiconductor film.

69. The display of claim 68 wherein said element is selected from the group consisting of Ni, Fe, Co, Ru, Rh, Pd, Os, Ir, Pt, Sc, Ti, V, Cr, Mn, Cu, Zn, Au and Ag.

70. The display of claim 49 wherein said source region and said drain region and said channel forming region are provided in a semiconductor film comprising a silicon and an element promoting crystallization of said semiconductor film.

71. The display of claim 70 wherein said element is selected from the group consisting of Ni, Fe, Co, Ru, Rh, Pd, Os, Ir, Pt, Sc, Ti, V, Cr, Mn, Cu, Zn, Au and Ag.

72. The display of claim 50 wherein said source region and said drain region and said channel forming region are provided in a semiconductor film comprising a silicon and an element promoting crystallization of said semiconductor film.

73. The display of claim 72 wherein said element is selected from the group consisting of Ni, Fe, Co, Ru, Rh, Pd, Os, Ir, Pt, Sc, Ti, V, Cr, Mn, Cu, Zn, Au and Ag.

74. The display of claim 51 wherein said source region and said drain region and said channel forming region are provided in a semiconductor film comprising a silicon and an element promoting crystallization of said semiconductor film.

75. The display of claim 74 wherein said element is selected from the group consisting of Ni, Fe, Co, Ru, Rh, Pd, Os, Ir, Pt, Sc, Ti, V, Cr, Mn, Cu, Zn, Au and Ag.

76. The display of claim 52 wherein said source region and said drain region and said channel forming region are provided in a semiconductor film comprising a silicon and an element promoting crystallization of said semiconductor film.

77. The display of claim 76 wherein said element is selected from the group consisting of Ni, Fe, Co, Ru, Rh, Pd, Os, Ir, Pt, Sc, Ti, V, Cr, Mn, Cu, Zn, Au and Ag.

78. The display of claim 53 wherein said source region and said drain region and said channel forming region are provided in a semiconductor film comprising a silicon and an element promoting crystallization of said semiconductor film.

79. The display of claim 78 wherein said element is selected from the group consisting of Ni, Fe, Co, Ru, Rh, Pd, Os, Ir, Pt, Sc, Ti, V, Cr, Mn, Cu, Zn, Au and Ag.

80. The display of claim 49 wherein said transparent organic film comprises polyimide.

81. The display of claim 50 wherein said transparent organic film comprises polyimide.

82. The display of claim 51 wherein said transparent organic film comprises polyimide.

83. The display of claim 52 wherein said transparent organic film comprises polyimide.

84. The display of claim 53 wherein said transparent organic film comprises polyimide.

85. The display of claim 49 wherein said pixel electrode comprises a transparent pixel electrode.

86. The display of claim 50 wherein said pixel electrode comprises a transparent pixel electrode.

87. The display of claim 51 wherein said pixel electrode comprises a transparent pixel electrode.

88. The display of claim 52 wherein said pixel electrode comprises a transparent pixel electrode.

89. The display of claim 53 wherein said pixel electrode comprises a transparent pixel electrode.

90. The display of claim 50 wherein said substrate comprises an insulating substrate.

91. The display of claim 52 wherein said substrate comprises an insulating substrate.

92. The display of claim 49 wherein said transparent organic film provides a leveled upper surface over said source region and said drain region and said channel forming region and said gate insulating film and said gate electrode.

93. The display of claim 50 wherein said transparent organic film provides a leveled upper surface over said source region and said drain region and said channel forming region and said gate insulating film and said gate electrode.

94. The display of claim 51 wherein said transparent organic film provides a leveled upper surface over said source region and said drain region and said channel forming region and said gate insulating film and said gate electrode.

95. The display of claim 52 wherein said transparent organic film provides a leveled upper surface over said source region and said drain region and said channel forming region and said gate insulating film and said gate electrode.

96. The display of claim 53 wherein said transparent organic film provides a leveled upper surface over said source region and said drain region and said channel forming region and said gate insulating film and said gate electrode.

97. The display of claim 49 wherein said pixel electrode comprises an indium tin oxide.

98. The display of claim 50 wherein said pixel electrode comprises an indium tin oxide.

99. The display of claim 51 wherein said pixel electrode comprises an indium tin oxide.

100. The display of claim 52 wherein said pixel electrode comprises an indium tin oxide.

101. The display of claim 53 wherein said pixel electrode comprises an indium tin oxide.

102. The display of claim 49 further comprising a lightly doped drain provided between said channel forming region and said drain region.

* * * * *

UNITED STATES PATENT AND TRADEMARK OFFICE
CERTIFICATE OF CORRECTION

| | | |
|---|---|---|
| PATENT NO. | : 6,310,362 B1 | Page 1 of 1 |
| DATED | : October 30, 2001 | |
| INVENTOR(S) | : Yasuhiko Takemura | |

It is certified that error appears in the above-identified patent and that said Letters Patent is hereby corrected as shown below:

<u>Title page,</u>
Insert: -- [73] Assignee:  Semiconductor Energy Laboratory Co., Ltd.
Kanagawa-ken, Japan --

Signed and Sealed this

Twenty-third Day of December, 2003

JAMES E. ROGAN
*Director of the United States Patent and Trademark Office*